US012640454B2

(12) United States Patent
Hong et al.

(10) Patent No.: US 12,640,454 B2
(45) Date of Patent: May 26, 2026

(54) WAVEGUIDE STRUCTURE

(71) Applicant: Menlo Microsystems, Inc., Irvine, CA (US)

(72) Inventors: Sanchien Hong, Placentia, CA (US); Wei Ye, Westford, MA (US); Hajime Terazawa, Carlsbad, CA (US)

(73) Assignee: Menlo Microsystems, Inc., Irvine, CA (US)

( * ) Notice: Subject to any disclaimer, the term of this patent is extended or adjusted under 35 U.S.C. 154(b) by 77 days.

(21) Appl. No.: 18/428,861

(22) Filed: Jan. 31, 2024

(65) Prior Publication Data

US 2025/0246790 A1    Jul. 31, 2025

(51) Int. Cl.
| | |
|---|---|
| *H01P 3/08* | (2006.01) |
| *B81B 7/00* | (2006.01) |
| *B81C 1/00* | (2006.01) |
| *H01P 11/00* | (2006.01) |

(52) U.S. Cl.
CPC .............. H01P 3/08 (2013.01); B81B 7/0006 (2013.01); B81C 1/00269 (2013.01); H01P 11/003 (2013.01)

(58) Field of Classification Search
CPC ....... H01P 3/08; H01P 11/003; B81C 1/00269
See application file for complete search history.

(56) References Cited

U.S. PATENT DOCUMENTS

| | | | |
|---|---|---|---|
| 6,143,997 A * | 11/2000 | Feng .......................... | H01P 1/12 200/181 |
| 6,940,363 B2 | 9/2005 | Zipper et al. | |

| | | |
|---|---|---|
| 6,992,629 B2 | 1/2006 | Kerner et al. |
| 7,084,724 B2 | 8/2006 | Cetiner et al. |

(Continued)

FOREIGN PATENT DOCUMENTS

| | | |
|---|---|---|
| CN | 100373516 C | 3/2008 |
| EP | 3188308 A1 | 7/2017 |

(Continued)

OTHER PUBLICATIONS

Eisenstadt, W. R., et al., "Microwave Differential Circuit Design USING Mixed-Mode S-Parameters", CD Rom Included, 2006, 247 pages.

(Continued)

*Primary Examiner* — Quan Tra
(74) *Attorney, Agent, or Firm* — Hamilton, Brook, Smith & Reynolds, P.C.

(57) ABSTRACT

A coplanar waveguide (CPW) structure on a micro-electro-mechanical system (MEMS) device may comprise a glass device substrate that hosts a MEMS component on a first surface of the glass device substrate. The glass device substrate may have an associated set of metal layers that are used for fabrication of the MEMS component. The CPW structure may further comprise a glass cap having a top metal layer and a bottom metal layer. The CPW structure may further comprise a CPW signal path on the first surface of the glass device substrate, and a CPW ground plane on the first surface of the glass device substrate along a side of the CPW signal path. The CPW ground plane may comprise the bottom metal layer of the glass cap and at least one metal layer of the set of metal layers that are used for fabrication of the at least one MEMS component.

19 Claims, 7 Drawing Sheets

(56)  References Cited

U.S. PATENT DOCUMENTS

| | | | |
|---|---|---|---|
| 7,315,223 | B2 | 1/2008 | Margomenos |
| 7,499,257 | B2 | 3/2009 | Lempkowski et al. |
| 7,824,997 | B2 | 11/2010 | Margomenos et al. |
| 8,592,876 | B2 | 11/2013 | Ding et al. |
| 9,048,053 | B2 | 6/2015 | Morihara et al. |
| 10,573,479 | B2 | 2/2020 | Stefanini et al. |
| 11,148,935 | B2 | 10/2021 | Zhu et al. |
| 12,476,627 | B2 | 11/2025 | Zhu et al. |
| 2008/0100394 | A1 | 5/2008 | Margomenos et al. |
| 2008/0278259 | A1* | 11/2008 | Ni ......................... H01P 1/2005 |
| | | | 333/32 |
| 2013/0168783 | A1* | 7/2013 | Ding ...................... G06F 30/36 |
| | | | 716/102 |
| 2014/0009244 | A1 | 1/2014 | Pavageau |
| 2014/0184352 | A1 | 7/2014 | Morihara et al. |
| 2014/0253260 | A1 | 9/2014 | Horimoto et al. |
| 2015/0353348 | A1* | 12/2015 | Vandemeer ......... B81C 1/00269 |
| | | | 257/415 |
| 2017/0278646 | A1 | 9/2017 | Morita |
| 2020/0102213 | A1 | 4/2020 | Haridas et al. |
| 2020/0270120 | A1* | 8/2020 | Zhu .................... B81C 1/00301 |
| 2022/0221670 | A1 | 7/2022 | Patra et al. |
| 2024/0056068 | A1 | 2/2024 | Zhu et al. |
| 2025/0243052 | A1 | 7/2025 | Zhu |

FOREIGN PATENT DOCUMENTS

| | | |
|---|---|---|
| EP | 3751735 A1 | 12/2020 |
| WO | 2024/036138 A1 | 2/2024 |

OTHER PUBLICATIONS

International Search Report and Written Opinion received for PCT Patent Application No. PCT/US23/71828, mailed on Nov. 28, 2023, 10 pages.

Pozer, D. M., "Microwave Engineering", Fourth Edition, 2012, John Wiley & Sons, Inc., 756 pages.

International Preliminary Report on Patentability for PCT/US2023/071828, Zhu, et al., entitled "High Frequency Differential Single Pole Multiple Throw Switch Module," 6 pp, Feb. 4, 2025.

International Search Report and Written Opinion received for PCT Patent Application No. PCT/US2025/013335, mailed on Apr. 16, 2025, 19 pages.

Notification of Transmittal of the International Search Report and the Written Opinion of the International Searching Authority, or the Declaration, PCT/US2025/013552, Hong et al., 14 pp, May 12, 2025.

* cited by examiner

COPLANAR GROUND PLANE 104a

SIGNAL CONDUCTOR 102

COPLANAR GROUND PLANE 104b

DIELECTRIC SUBSTRATE 106

COPLANAR GROUND PLANE 104a

SIGNAL CONDUCTOR 102

COPLANAR GROUND PLANE 104b

DIELECTRIC SUBSTRATE 106

SUBSTRATE GROUND PLANE 108

CONDUCTIVE VIA 110

SEAL
METAL
326

MET1
322
TRACE PLATE
324

SEAL
METAL
326

CAP BOT
METAL
312

TGV
(TO CAP TOP METAL)
208

TGV
(TO SIGNAL PORT)
204

WAVEGUIDE STRUCTURE

BACKGROUND

Micro-electrical-mechanical system (MEMS) devices have utility in high-frequency applications such as switching of radio frequency (RF) signals. Transmission line architectures such as microstrip and stripline are often used to convey such high-frequency signals to and from the MEMS devices. A microstrip or stripline transmission line may, however, distort the signal being transmitted. Process limitations associated with the MEMS technology may preclude the use of transmission line technologies that are capable of conveying higher frequency signals with less distortion.

SUMMARY

In transmission line theory, a Coplanar Waveguide (CPW) has lower-loss performance at higher frequencies compare to, for example, microstrip. A coplanar waveguide situates a signal conductor and one or more reference ground conductors in a common plane. The signal conductor and the ground planes are situated on a dielectric substrate (e.g., glass). A Grounded Coplanar Waveguide (GCPW) includes all the elements of the CPW and adds a substrate ground plane. Conductive vias, disposed through the dielectric substrate, electrically couple the coplanar ground planes to the substrate ground plane.

The example embodiments described herein are directed to a CPW structure disposed in a micro-electrical-mechanical system (MEMS) device to convey a high-frequency signal (e.g., a radio frequency (RF) signal) from a port on the MEM device to a destination within the MEMS device (e.g., to an input or output of a MEMS switch). The overall signal to the switch may span a frequency of DC to 20 GHz, with the high-frequency signal spanning, for example, a range of 1 MHz to 20 GHz, although the upper end of the frequency range may extend to 300 GHz. The embodiments are also directed to an implementation of the coplanar ground plane on the CPW or GCPW structure that avoids interfering with electrical conductors that are disposed on the MEMS device.

In one aspect, a coplanar waveguide (CPW) structure of a micro-electromechanical system (MEMS) device may comprise a device substrate that hosts at least one MEMS component on a first surface of the device substrate. The device substrate may have an associated set of metal layers that are used for fabrication of the at least one MEMS component. The CPW structure may further comprise a cap having a top metal layer and a bottom metal layer and having a cavity into which the at least one MEMS component is hermetically scaled by the cap bonded to the first surface of the device substrate. The CPW structure may further comprise a CPW signal path disposed on the first surface of the device substrate, and a CPW ground plane disposed on the first surface of the device substrate along a side of the CPW signal path. The CPW ground plane may comprise (i) the bottom metal layer of the cap and (ii) at least one metal layer of the set of metal layers that are used for fabrication of the at least one MEMS component.

In an embodiment, two or more metal layers of the set of metal layers may form a bridge structure that enables crossing of the CPW ground plane and a signal line without electrical coupling of the CPW ground plane to the signal line. The two or more metal layers of the set of metal layers that are used to form a bridge structure may be a first metal layer, a trace plate layer, and a seal metal layer. The bridge structure may comprise two portions of the first metal layer disposed on either side of the signal line and a portion of the trace plate layer disposed on top of the two portions of the first metal layer. The seal metal layer may electrically couple the bridge structure to the bottom metal layer of the cap.

The cap may be a glass cap, and a through-glass via (TGV) in the glass cap may electrically couple the top metal layer to the bottom metal layer.

In another aspect, a structure on a micro-electromechanical system (MEMS) device that isolates two intersecting electrical paths may comprise a device substrate that hosts at least one MEMS component on a first surface of the device substrate. The device substrate may have a set of metal layers that are used for fabrication of the at least one MEMS component. The structure may further comprise a first electrical path disposed on the first surface of the glass device substrate that intersects a second electrical path, and a bridge structure in the first electrical path that spans the second electrical path. The bridge structure may comprise at least two metal layers of the set of metal layers used for fabrication of the at least one MEMS component.

The set of metal layers may comprise (i) a first metal layer, (ii) a trace plate layer, and (iii) a seal metal layer. The structure may further comprise a glass cap having a top metal layer and a bottom metal layer and having a cavity into which the at least one MEMS component is hermetically sealed by the glass cap bonded to the first surface of the glass device substrate. The first signal path may be a CPW signal path disposed on the first surface of the glass device substrate, and the second signal path may be a CPW ground plane disposed on the first surface of the glass device substrate along a side of the CPW signal path. The CPW ground plane may comprise the bottom metal layer of the glass cap and at least one metal layer of the set of metal layers that are used for fabrication of the at least one MEMS component.

A through-glass via (TGV) in the glass cap may electrically couple the top metal layer to the bottom metal layer. The two or more of the set of metal layers that are used to form a bridge structure may be a first metal layer and a trace plate layer. The bridge structure may comprise two portions of the first metal layer disposed on either side of the signal line and a portion of the trace plate layer disposed on top of the two portions of the first metal layer. The seal metal layer may electrically couple the bridge structure to the bottom metal layer of the glass cap.

In another aspect, a method of fabricating a micro-electromechanical system (MEMS) device may comprise hosting a MEMS component on a first surface of a glass device substrate. The glass device substrate may have an associated set of metal layers that are used for fabrication of the at least one MEMS component. The method may further comprise disposing a CPW signal path on the first surface of the glass device substrate, disposing a CPW ground plane on the first surface of the glass device substrate along a side of the CPW signal path, and bonding a glass cap to the glass device substrate. The glass cap may have a cap top metal layer and a cap bottom metal layer, and a cavity into which the at least one MEMS component is hermetically sealed when the glass cap is bonded to the first surface of the glass device substrate. The CPW ground plane may comprise (i) the bottom metal layer of the glass cap and (ii) at least one metal layer of the set of metal layers that are used for fabrication of the at least one MEMS component.

The method may further comprise using two or more of the set of metal layers to form a bridge structure that facilitates intersection of the CPW ground plane and a signal line without electrical coupling of the CPW ground plane to the signal line. The two or more of the set of metal layers that are used to form a bridge structure may be a first metal layer and a trace plate layer. The method may further comprise forming the bridge structure by disposing two portions of the first metal layer on either side of the signal line and disposing a portion of the trace plate layer on top of the two portions of the first metal layer. The method may further comprise coupling the bridge structure to the bottom metal layer of the glass cap with a seal metal layer that is used to seal the glass cap to the glass device substrate. The method may further comprise using a through-glass via to electrically coupling the cap top metal layer to the cap bottom metal layer.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The example embodiments described herein are directed to a coplanar waveguide (CPW) structure, implemented in a micro-electrical-mechanical system (MEMS) device. The CPW structure serves as a transmission line for radio frequency (RF) and higher frequency signals. Through-glass vias (TGVs) that are connected to a ground plane may be "stitched" along a signal line to provide the CPW ground plane required for CPW functionality.

Figure 1A:
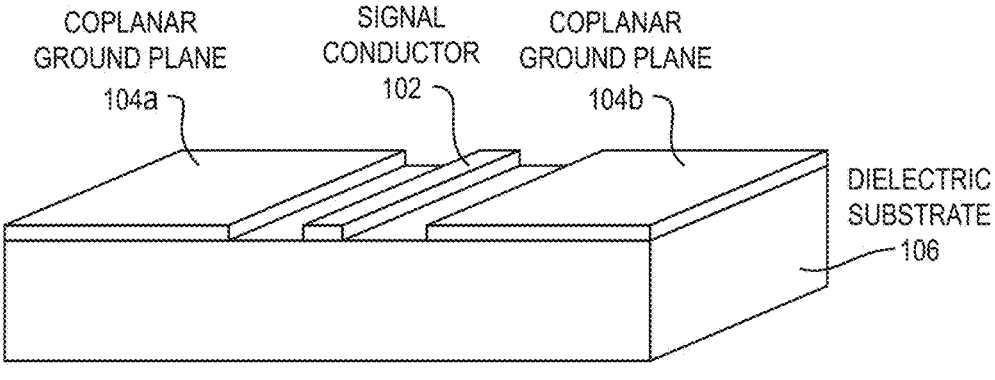
FIG. 1A illustrates an implementation of a coplanar waveguide (CPW) structure according to an example embodiment.
Figure 1B:
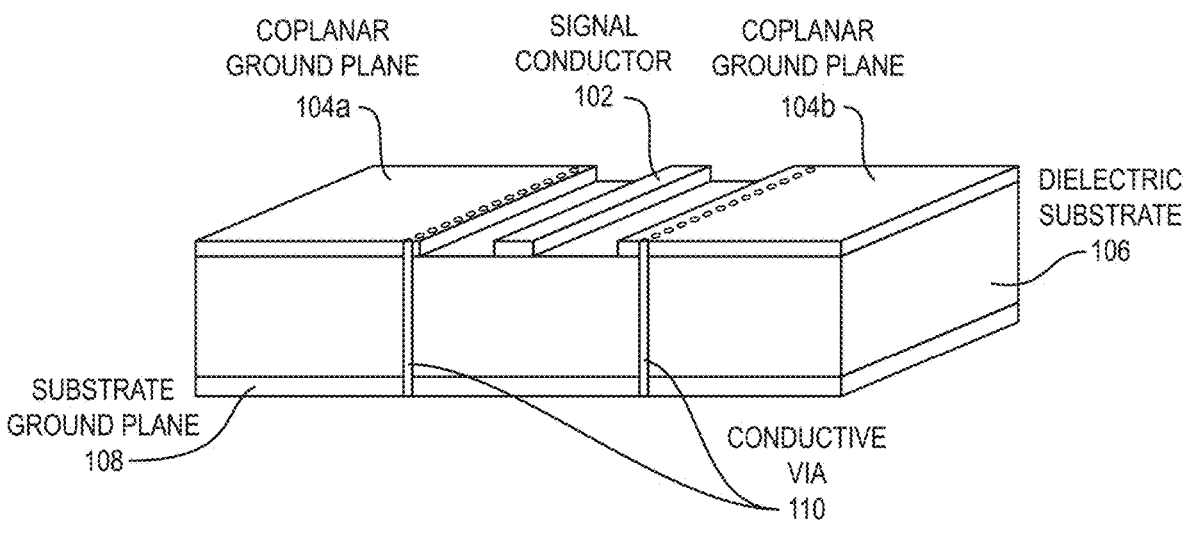
FIG. 1B illustrates an implementation of a grounded coplanar waveguide (GCPW) structure according to an example embodiment.

In transmission line theory, a Coplanar Waveguide (CPW) has lower-loss performance at higher frequencies compare to, for example, microstrip. A coplanar waveguide situates a signal conductor and one or more reference ground conductors in a common plane, as shown in FIG. 1A. As shown, the signal conductor 102 and the ground planes 104a, 104b are situated on a dielectric substrate 106 (e.g., glass). FIG. 1B illustrates a Grounded Coplanar Waveguide (GCPW) that includes all the elements of FIG. 1A and adds a substrate ground plane 108. Conductive vias 110, disposed through the dielectric substrate 106, electrically couple the coplanar ground planes 104a, 104b to the substrate ground plane 108.

The example MEMS device comprises a glass (e.g., fused silica) MEMS device substrate that hosts at least one MEMS component (e.g., a MEMS switch) and a glass (e.g., fused silica) MEMS device cap that is configured to be bonded to the MEMS device substrate. Although the device substrate and cap are glass in the example embodiment, other substrate and cap materials may alternatively be used. As used herein, a substrate "hosting" a component means that the substrate provides a platform upon which the component is securely mounted. The MEMS device cap has a cavity formed into a surface of the cap. The cavity is configured so that when the device cap is bonded to the device substrate, the one or more MEMS components are hermetically sealed within the cavity.

The CPW structure is configured to convey electrical signals at radio frequency (RF) frequencies or higher from a port of the MEMS device to the at least one component (e.g., a MEMS switch) within the MEMS device. The CPW structure of the described embodiments is implemented within the MEMS device without requiring modification to the process used to fabricate the MEMS device. As described in more detail herein, the CPW structure is constructed using only the materials and fabrication layers that are used to fabricate the MEMS device without the CPW structure.

Figure 2A:
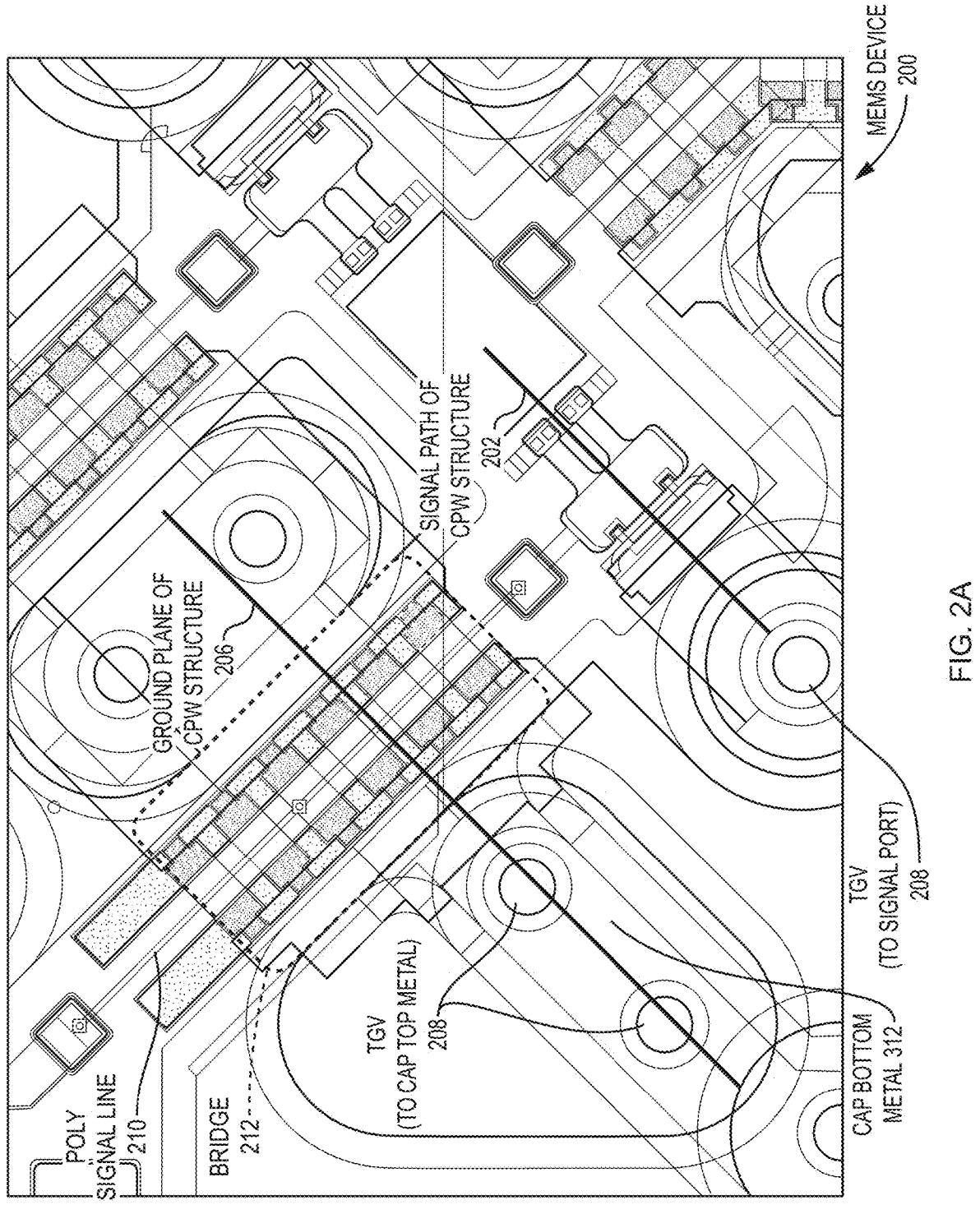
FIG. 2A shows an RF signal path of an example CPW structure according to an example embodiment.
Figure 2B:
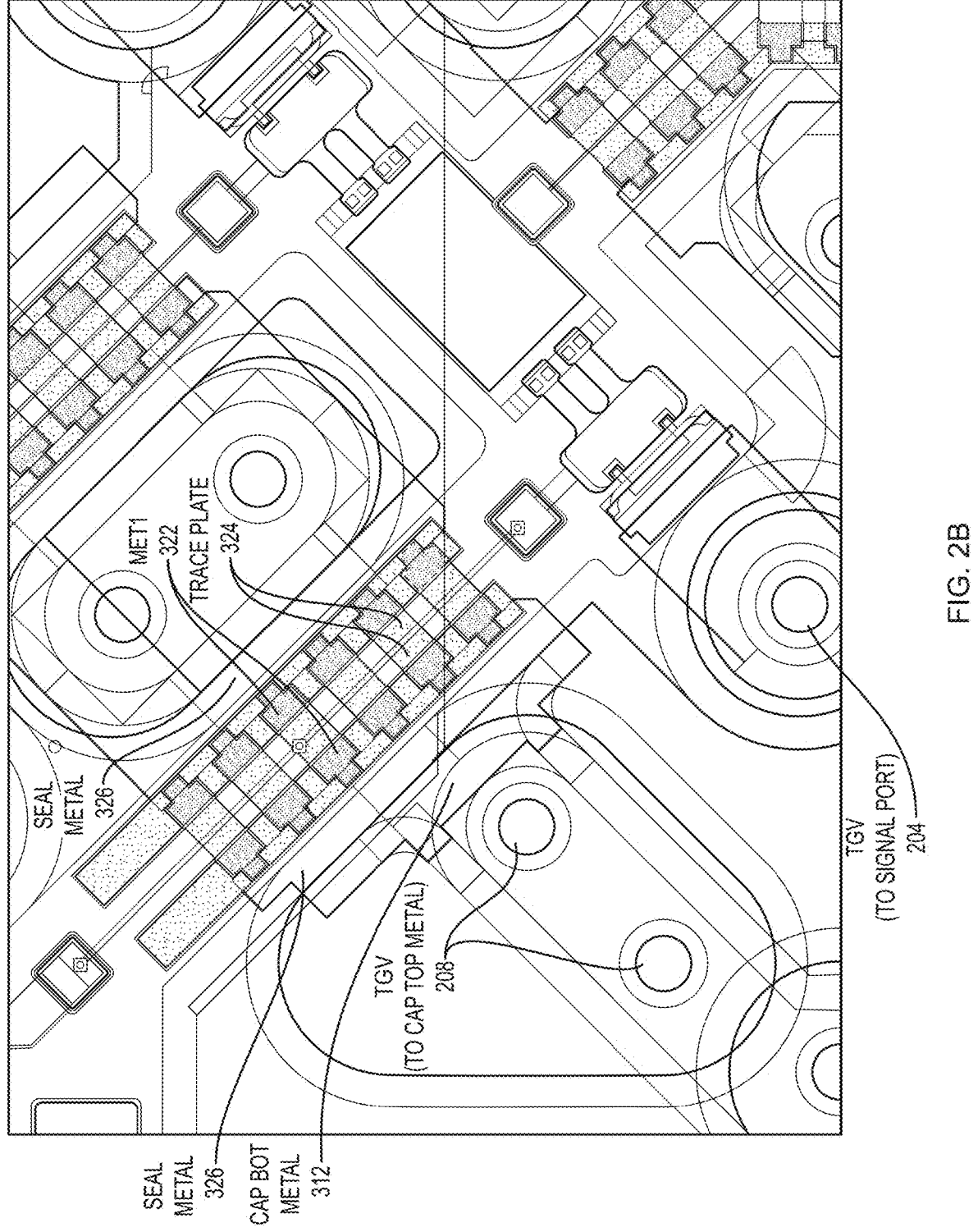
FIG. 2B identifies certain components of the bridge shown in FIG. 2A according to an example embodiment.

FIGS. 2A and 2B illustrate an example CPW structure on a MEMS device 200. FIG. 2A shows an RF signal path 202 of an example CPW structure. Signal path 202 corresponds to signal conductor 102 of FIGS. 1A and 1B and is electrically coupled to an external port of the MEMS device by the signal through glass via (TGV) 204. FIG. 2A also shows the CPW ground plane 206, which corresponds to the coplanar ground plane 104a or 104b in FIGS. 1A and 1B. The CPW ground plane 206 is electrically coupled to the ground plane on top of the glass cap (i.e., the cap top metal 310) by TGVs 208.

FIG. 2A further shows a polycrystalline silicon (poly) signal line 210 that lies in the path of the CPW ground plane 206. To allow crossing of the CPW ground plane 206 with the poly signal line 210 while avoiding electrically coupling the poly signal line 210 with the CPW ground plane 206, the path of the CPW ground plane 206 includes a bridge 212 over the poly signal line 210, as shown in FIG. 2A. The CPW ground plane 206 thus comprises cap bottom metal 312 and the bridge 212. The cap bottom metal 312 is electrically coupled to the cap top metal 310 by TGVs 208.

Figure 3:
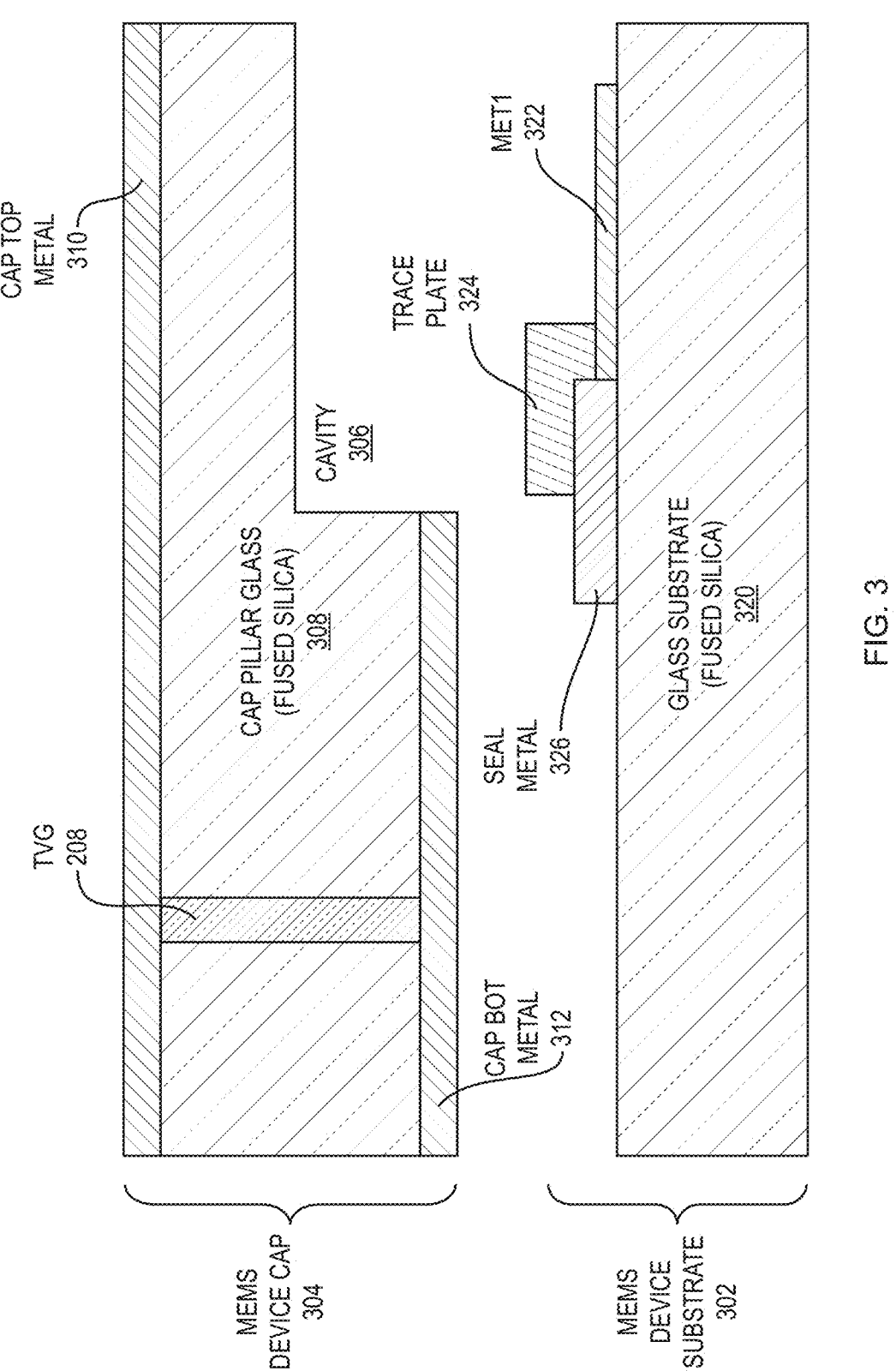
FIG. 3 illustrates an example set of the process layers of the bridge according to the invention.

FIG. 2B shows certain components of the bridge 212. The bridge 212 is constructed only of layers available in the process used to fabricate the MEMS component itself. FIG. 3, which illustrates an example set of such layers, shows a MEMS device substrate 302 and a MEMS device cap 304 configured to be bonded to the MEMS device substrate 302 to form a hermetically sealed cavity 306 in which the MEMS components (not shown) reside. The MEMS device cap 304 comprises a cap glass substrate 308 on which a cap top metal 310 layer and a cap bottom metal 312 layer are disposed. A TGV 208 electrically couples the top metal 310 to the bottom metal 312. The MEMS device substrate 302 comprises a glass substrate body 320 (e.g., fused silica) upon which a set of layers may be disposed, for example a first metal layer 322, a trace plate layer 324, and a seal metal layer 326. The first metal layer 322 is used for making electrical connections to the MEMS device, and the trace plate layer 324 is used for electrical connection to the MEMS device that covers above (or on top of) the first metal layer 322.

Figure 4A:
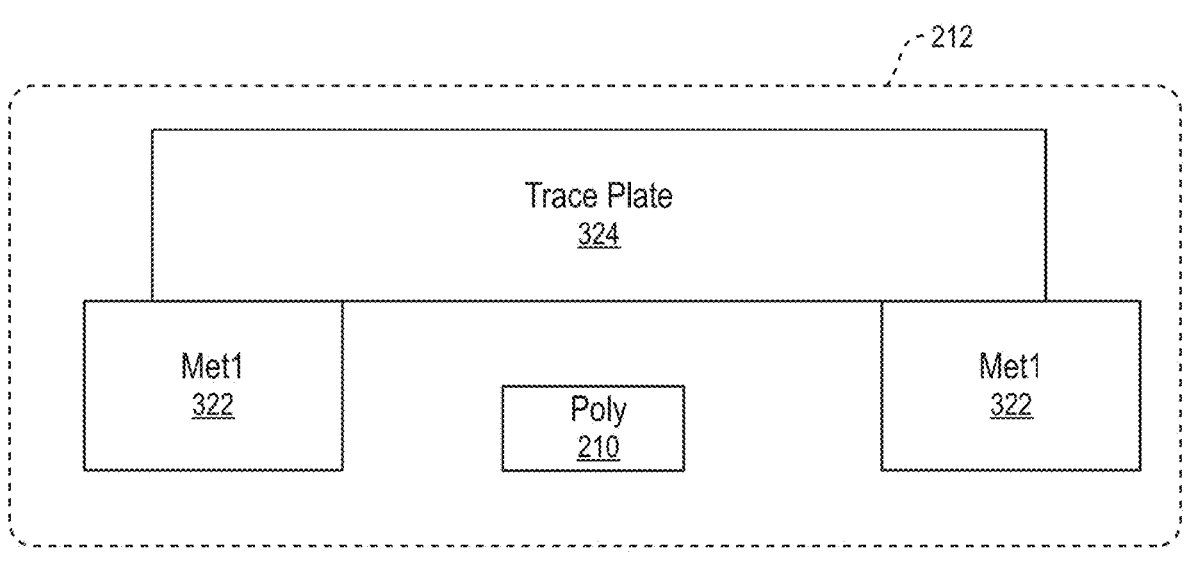
FIG. 4A shows a side view of a bridge spanning a poly signal line according to an example embodiment.
Figure 4B:
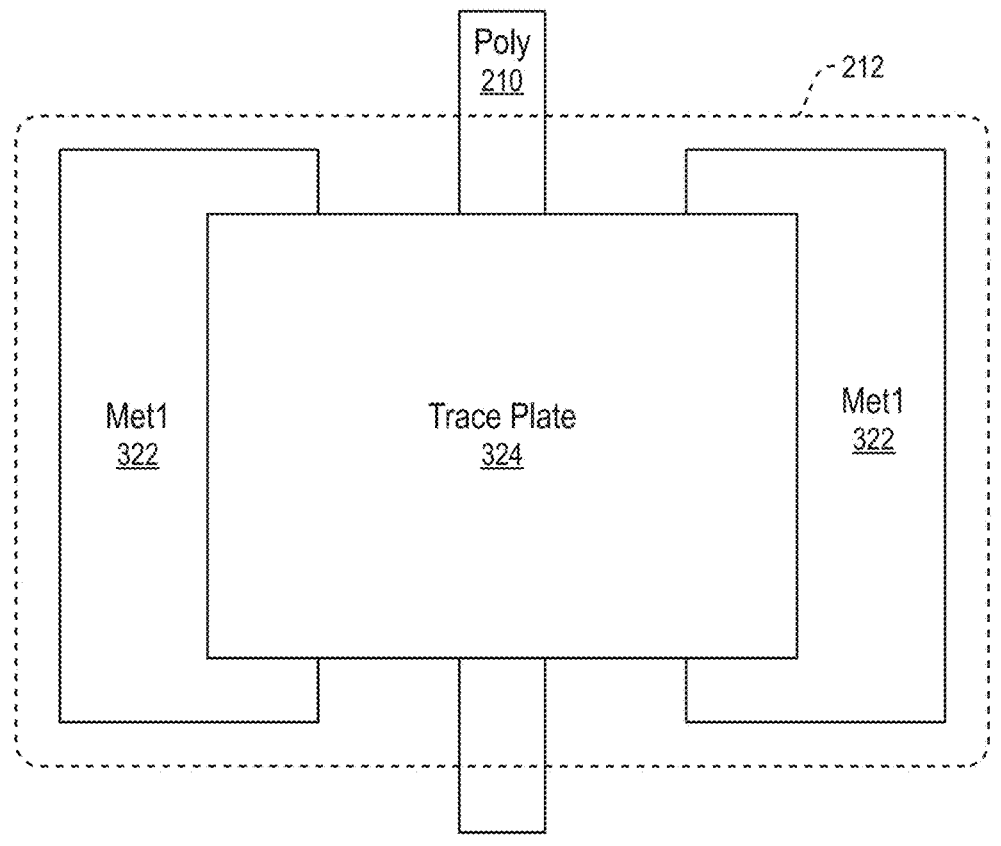
FIG. 4B shows a top view of the bridge depicted in FIG. 4A.

As shown in FIGS. 4A and 4B, the bridge 212 comprises the first metal layer 322 and trace plate layer 324, which are layers of the original MEMS device topology (i.e., the various layers and geometries used to construct the MEMS component). FIG. 4A is a side view of the bridge 212, and FIG. 4B is a top view of the bridge 212. Two portions of the first metal layer 322 are disposed along opposite sides of a poly line 210, and a portion of trace plate layer 324 spans the two portions of the first metal layer 322, such that the poly line 210 is disposed in a space that is bounded on the sides by the portions of the first metal layer 322 and above by the trace plate layer 324. The bridge 212 and its constituent components are further illustrated in FIG. 2B.

As shown in FIG. 2A, the ground plane of CPW structure 206 comprises cap bottom metal 312 and TGVs that electrically couple the cap bottom metal 312 and the cap top metal 310, and the bridge 212. The cap bottom metal 312 is a component of the cap 304, and the bridge 212 comprises components of the MEMS device substrate. To make the CPW structure 206 a continuous ground, the cap bottom metal 312 is electrically coupled to the bridge 212. In the example embodiments, the cap bottom metal 312 is electrically coupled to the bridge 212 with seal metal layer 326. In the MEMS device 200, the seal metal layer 326 is used to bond the MEMS device cap 304 to the MEMS device substrate 302 using, for example, a thermo-compression process. Outside if its use for bonding the cap to the device substrate thereby hermetically sealing the device cavity, the use of seal metal layer 326 is limited to electrical coupling of the cap bottom metal to the bridge 212 structure, because an excessive use of scal metal 326 (i.e., beyond its use in bonding the cap to the device substrate) may lead to reduced yields of the device fabrication process.

Figure 5A:
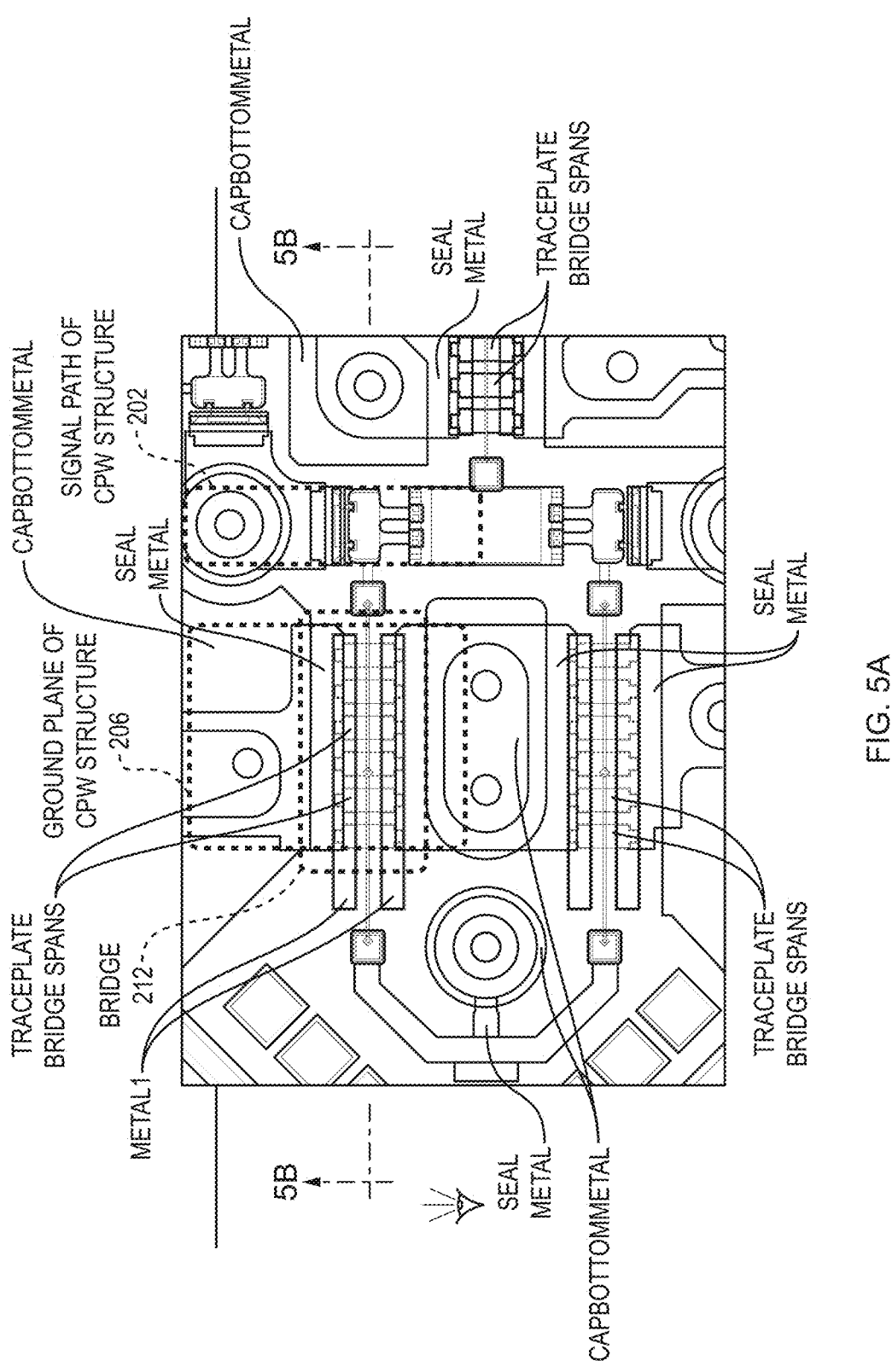
FIGS. 5A and 5B show an alternative example embodiment of a CPW structure.
Figure 5B:
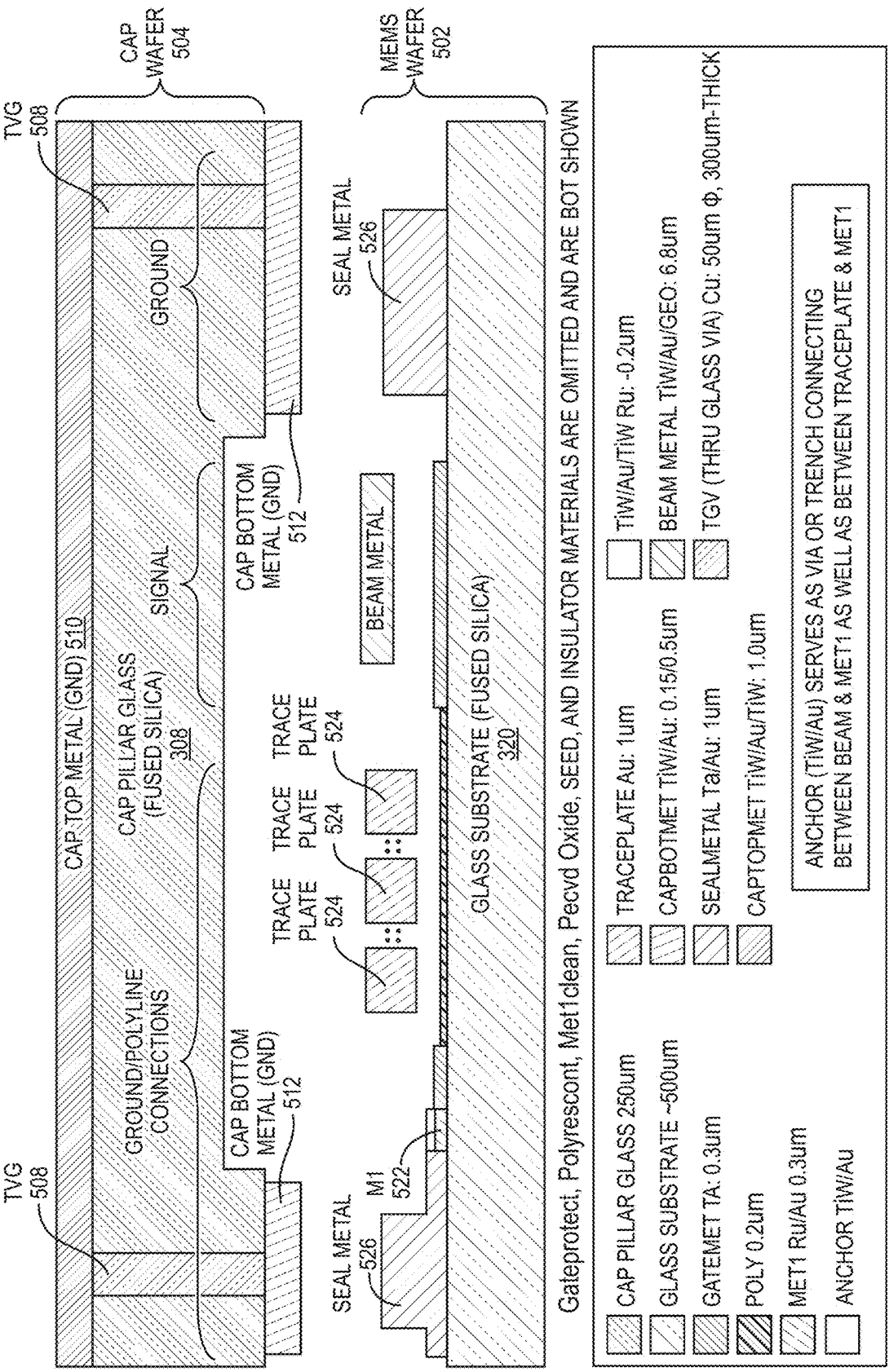

FIGS. 5A and 5B illustrate another example embodiment of a CPW structure on a MEMS device. FIG. 5A shows a similar CPW ground plane 206 and CPW signal path 202 as depicted in the examples of FIGS. 2A and 2B. FIG. 5B shows a cross-section of the architecture in FIG. 5A (section 5B-5B), with the MEMS device cap 504 configured to be bonded to the MEMS device substrate 502. The cross-sectional view shows trace plate metal segments 524, the Met1 layer 522, the cap bottom metal 512, the cap top metal 510, the TGV 508 electrically coupling the cap top metal 510 to the cap bottom metal 512, and the seal metal 526 used to electrically couple the cap bottom metal 512 to the cap top metal 510.

While example embodiments have been particularly shown and described, it will be understood by those skilled in the art that various changes in form and details may be made therein without departing from the scope of the embodiments encompassed by the appended claims.

What is claimed is:

1. A coplanar waveguide (CPW) structure of a micro-electromechanical system (MEMS) device, comprising:
    a device substrate that hosts at least one MEMS component on a first surface of the device substrate, the device substrate having an associated set of metal layers that are used for fabrication of the at least one MEMS component;
    a cap having a top metal layer and a bottom metal layer, and having a cavity into which the at least one MEMS component is hermetically sealed by the cap bonded to the first surface of the device substrate;
    a CPW signal path disposed on the first surface of the device substrate;
    a CPW ground plane disposed on the first surface of the device substrate along a side of the CPW signal path, the CPW ground plane comprising (i) the bottom metal layer of the cap and (ii) at least one metal layer of the set of metal layers that are used for fabrication of the at least one MEMS component.

2. The CPW structure of claim 1, wherein two or more metal layers of the set of metal layers form a bridge structure that enables crossing of the CPW ground plane and a signal line without electrical coupling of the CPW ground plane to the signal line.

3. The CPW structure of claim 2, wherein the two or more metal layers of the set of metal layers that are used to form a bridge structure are a first metal layer, a trace plate layer, and a seal metal layer.

4. The CPW structure of claim 3, wherein the bridge structure comprises two portions of the first metal layer disposed on either side of the signal line and a portion of the trace plate layer disposed on top of the two portions of the first metal layer.

5. The CPW structure of claim 3, wherein the seal metal layer electrically couples the bridge structure to the bottom metal layer of the cap.

6. The CPW structure of claim 1, wherein the cap is a glass cap, and a through-glass via (TGV) in the glass cap electrically couples the top metal layer to the bottom metal layer.

7. A structure on a micro-electromechanical system (MEMS) device that isolates two intersecting electrical paths, comprising:
    a device substrate that hosts at least one MEMS component on a first surface of the device substrate, the device substrate having a set of metal layers that are used for fabrication of the at least one MEMS component;
    a first electrical path disposed on the first surface of the glass device substrate that intersects a second electrical path;
    a bridge structure in the first electrical path that spans the second electrical path, the bridge structure comprising at least two metal layers of the set of metal layers used for fabrication of the at least one MEMS component, the at least two layers of the set of metal layers comprises two or more of (i) a first metal layer, (ii) a trace plate layer, and (iii) a seal metal layer.

8. The structure of claim 7, further comprising:
    a glass cap having a top metal layer and a bottom metal layer, and having a cavity into which the at least one MEMS component is hermetically sealed by the glass cap bonded to the first surface of the glass device substrate;
    wherein a first signal path is a CPW signal path disposed on the first surface of the glass device substrate, and a second signal path is a CPW ground plane disposed on the first surface of the glass device substrate along a side of the CPW signal path.

9. The structure of claim 8, wherein the CPW ground plane comprises the bottom metal layer of the glass cap and at least one metal layer of the set of metal layers that are used for fabrication of the at least one MEMS component.

10. The structure of claim 8, wherein a through-glass via (TGV) in the glass cap electrically couples the top metal layer to the bottom metal layer.

11. The structure of claim 7, wherein the at least two metal layers of the set of metal layers that are used to form a bridge structure are a first metal layer and a trace plate layer.

12. The structure of claim 11, wherein the bridge structure comprises two portions of the first metal layer disposed on either side of a signal line and a portion of the trace plate layer disposed on top of the two portions of the first metal layer.

13. The structure of claim 11, wherein the seal metal layer electrically couples the bridge structure to a bottom metal layer of the glass cap.

14. A method of fabricating a micro-electromechanical system (MEMS) device, comprising:

hosting a MEMS component on a first surface of a glass device substrate, the glass device substrate having an associated set of metal layers that are used for fabrication of the at least one MEMS component;

disposing a CPW signal path on the first surface of the glass device substrate;

disposing a CPW ground plane on the first surface of the glass device substrate along a side of the CPW signal path;

bonding a glass cap to the glass device substrate, the glass cap having a cap top metal layer and a cap bottom metal layer, and having a cavity into which the at least one MEMS component is hermetically sealed when the glass cap is bonded to the first surface of the glass device substrate;

the CPW ground plane comprises (i) the bottom metal layer of the glass cap and (ii) at least one metal layer of the set of metal layers that are used for fabrication of the at least one MEMS component.

15. The method of claim 14, further comprising using two or more of the set of metal layers to form a bridge structure that facilitates intersection of the CPW ground plane and a signal line without electrical coupling of the CPW ground plane to the signal line.

16. The method of claim 15, wherein the two or more of the set of metal layers that are used to form a bridge structure are a first metal layer and a trace plate layer.

17. The method of claim 16, further comprising forming the bridge structure by disposing two portions of the first metal layer on either side of the signal line and disposing a portion of the trace plate layer on top of the two portions of the first metal layer.

18. The method of claim 15, further comprising coupling the bridge structure to the bottom metal layer of the glass cap with a seal metal layer that is used to seal the glass cap to the glass device substrate.

19. The method of claim 14, further comprising using a through-glass via to electrically couple the cap top metal layer to the cap bottom metal layer.

* * * * *